US008004860B2

(12) United States Patent
Salzman

(10) Patent No.: US 8,004,860 B2
(45) Date of Patent: Aug. 23, 2011

(54) RADIOFREQUENCY AND ELECTROMAGNETIC INTERFERENCE SHIELDING

(75) Inventor: James F. Salzman, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 11/468,104

(22) Filed: Aug. 29, 2006

(65) Prior Publication Data
US 2008/0055878 A1 Mar. 6, 2008

(51) Int. Cl.
*H05K 9/00* (2006.01)

(52) U.S. Cl. ........ 361/818; 361/800; 361/816; 361/753; 361/799; 174/350; 174/377

(58) Field of Classification Search .................. 361/753, 361/799, 800, 816, 818; 174/350, 351
See application file for complete search history.

(56) References Cited

U.S. PATENT DOCUMENTS

| | | | | |
|---|---|---|---|---|
| 3,754,399 A | * | 8/1973 | Ono et al. ........................ 60/309 |
| 5,160,374 A | * | 11/1992 | Frederickson et al. ....... 106/401 |
| 5,166,864 A | * | 11/1992 | Chitwood et al. ............ 361/720 |
| 5,318,855 A | * | 6/1994 | Glovatsky et al. ............ 428/457 |
| 5,359,496 A | * | 10/1994 | Kornrumpf et al. .......... 361/795 |
| 5,394,304 A | * | 2/1995 | Jones ............................. 361/765 |
| 5,557,064 A | * | 9/1996 | Isern-Flecha et al. ........ 174/393 |
| 5,639,989 A | * | 6/1997 | Higgins, III .................. 174/386 |
| 5,981,043 A | * | 11/1999 | Murakami et al. ............ 428/209 |
| 6,110,563 A | * | 8/2000 | Pienimaa et al. .............. 428/137 |
| 6,140,575 A | * | 10/2000 | Gunten et al. ................. 174/363 |
| 6,596,937 B2 | * | 7/2003 | Mazurkiewicz ............... 174/394 |
| 6,600,101 B2 | * | 7/2003 | Mazurkiewicz ............... 174/388 |
| 6,674,652 B2 | * | 1/2004 | Forte et al. .................... 361/800 |
| 6,717,485 B2 | * | 4/2004 | Kolb et al. ........................ 333/12 |
| 6,768,654 B2 | * | 7/2004 | Arnold et al. ................. 361/818 |
| 6,849,800 B2 | * | 2/2005 | Mazurkiewicz ............... 174/394 |
| 6,900,383 B2 | * | 5/2005 | Babb et al. .................... 174/394 |
| 7,109,817 B2 | * | 9/2006 | Kolb et al. ........................ 333/12 |
| 7,129,422 B2 | * | 10/2006 | Arnold .......................... 174/377 |
| 7,196,275 B2 | * | 3/2007 | Babb et al. .................... 174/382 |
| 7,202,422 B2 | * | 4/2007 | Ogatsu .......................... 174/373 |
| 7,214,889 B2 | * | 5/2007 | Mazurkiewicz ............... 174/386 |

* cited by examiner

*Primary Examiner* — Dameon E Levi
(74) *Attorney, Agent, or Firm* — Ronald O. Neerings; Wade James Brady, III; Frederick J. Telecky, Jr.

(57) ABSTRACT

An electrical device comprising an electronic component mounted to a surface of a printed circuit board, a ground connection on said surface, and electromagnetic interference (EMI) shielding. The EMI shielding includes an electrical insulator coating the electronic component, the insulator contacting the surface, and a conductive layer covering the electrical insulator, and contacting the electrical insulator and the ground connection.

23 Claims, 4 Drawing Sheets

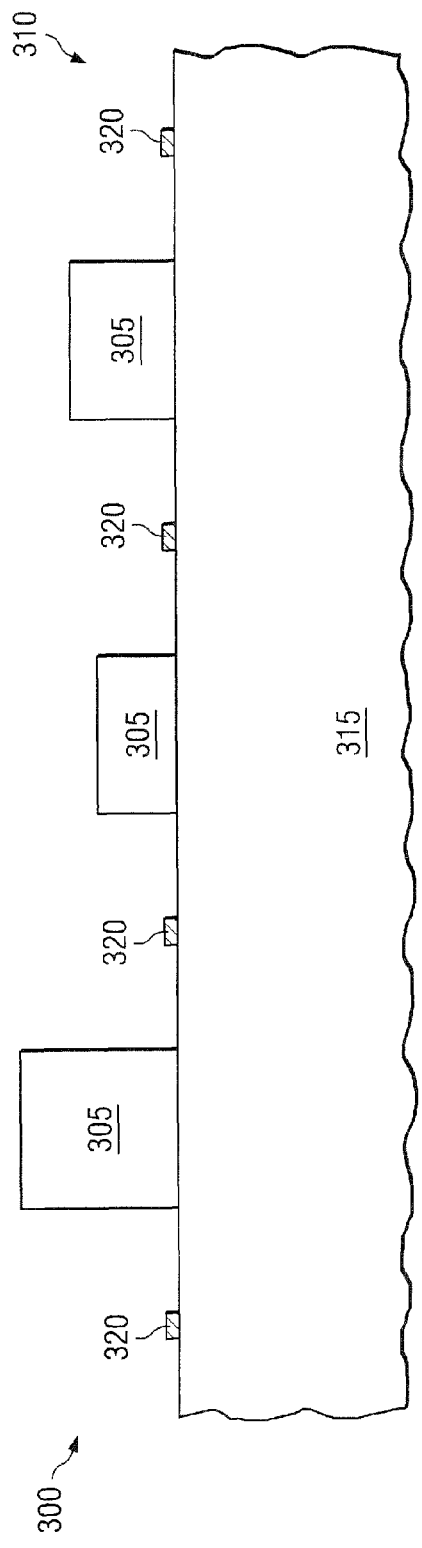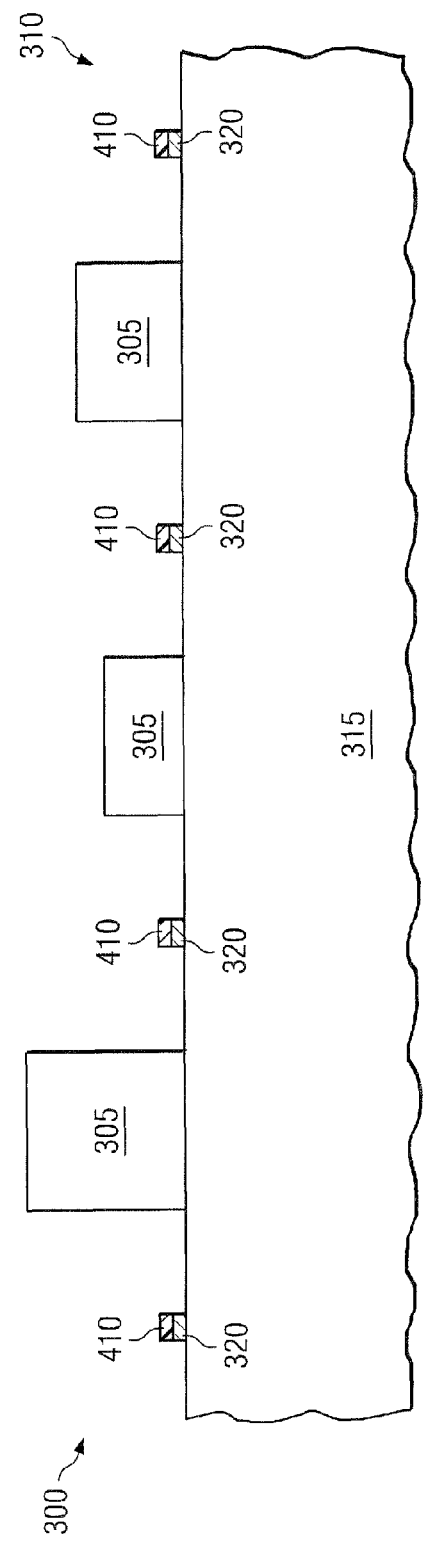

RADIOFREQUENCY AND ELECTROMAGNETIC INTERFERENCE SHIELDING

TECHNICAL FIELD

Figure 1:
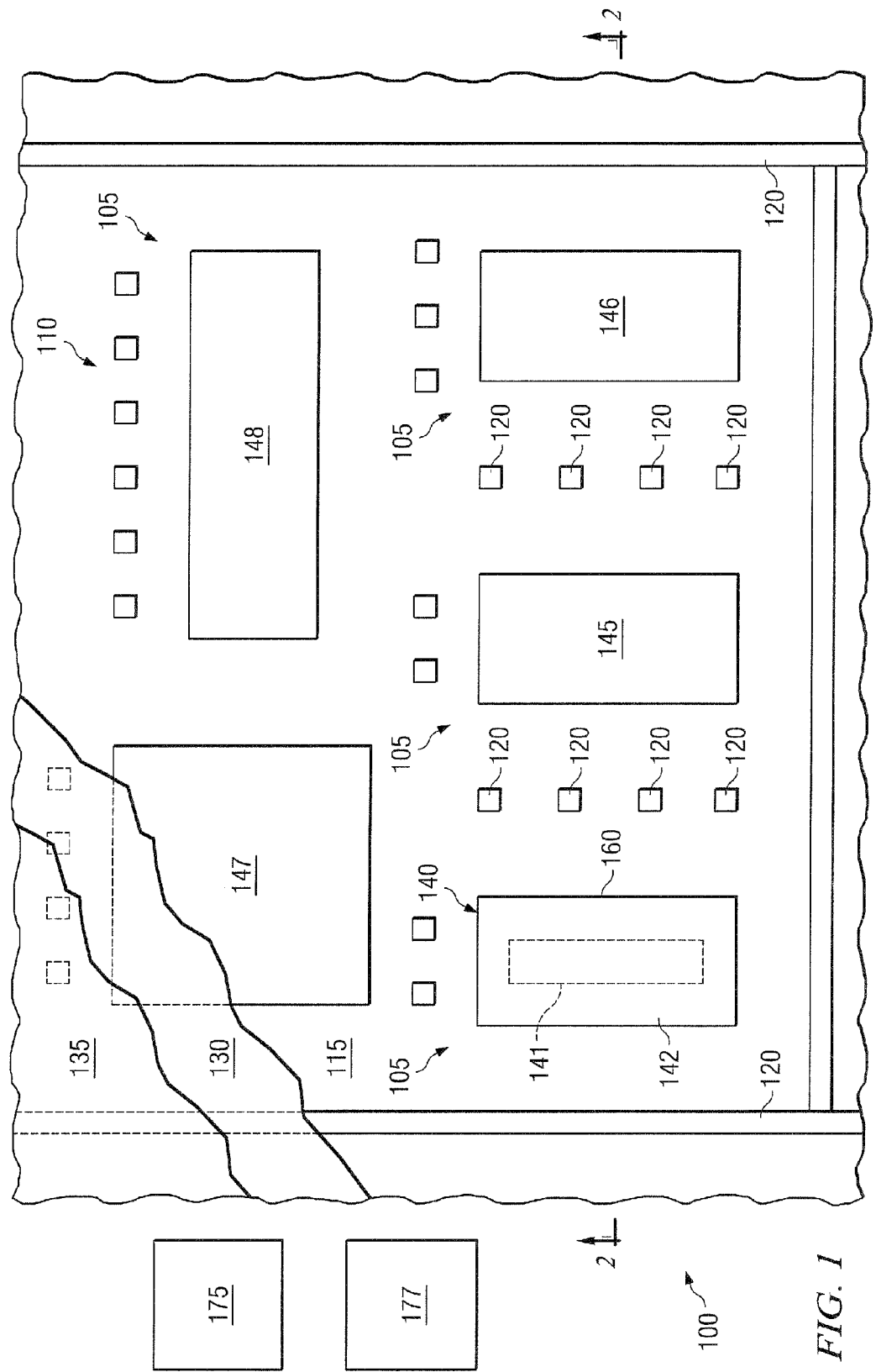

The present invention is directed to a shielded electrical device and a method for manufacturing a shielded electrical device.

BACKGROUND

Electrical devices have components that can generate, or be affected by electromagnetic interference (EMI, also known as radio frequency interference). Sometimes it is critical to attenuate EMI so that the device will comply with governmental or industry standards. To attenuate EMI, the electronic component is typically placed inside a metal container (e.g., a "can") that forms a Faraday shield around the component. The process of forming shielding around individual electronic components is laborious and expensive. The walls of cans are formed into frames for each component by stamping or bending metal sheets. The frames are soldered to the printed circuit board (PCB), individual or several electronic components are located inside of the frame, a metal top is placed over the frame, and the can is soldered shut. Because the dimensions of the can is larger than the component or components being shielded, the can occupies more space on the PCB than the components. This, in turn, may require the device to be larger than desired. Moreover, if the electronic component needs troubleshooting or reworking, it is difficult to open the can, and sometimes the electronic component is damaged while trying to open the can.

Accordingly, what is needed in the art is EMI shielding and its method of manufacture that is inexpensive and easy to implement for a variety of differently shaped and dimensioned electronic components.

SUMMARY

The invention provides in one embodiment, an electrical device. The device comprises an electronic component mounted to a surface of a printed circuit board, a ground connection on said surface, and electromagnetic interference (EMI) shielding. The EMI shielding includes an electrical insulator coating the electronic component, the insulator contacting the surface, and a conductive layer covering the electrical insulator, and contacting the electrical insulator and the ground connection.

Another embodiment is an electrical communication device, comprising a plurality electronic components mounted to a surface of a printed circuit board. At least one of the electronic components comprises an integrated circuit die surrounded by an injection mold. The device also includes one or more ground connections on the surface and electromagnetic interference (EMI) shielding as described above. The conductive layer is configured to block electromagnetic interference (EMI) to or from the electronic components.

Still another embodiment is a method of manufacturing an electronic device. The method comprises mounting an electronic component to a surface of a printed circuit board, forming a ground connection on the surface and shielding the electronic component. Shielding includes coating the electronic component with an electrical insulator, the electrical insulator contacting said surface. Shield also includes covering the electrical insulator and the surface with a conductive layer, such that the conductive layer contacts the electrical insulator and the ground connection.

DRAWINGS

Figure 2:
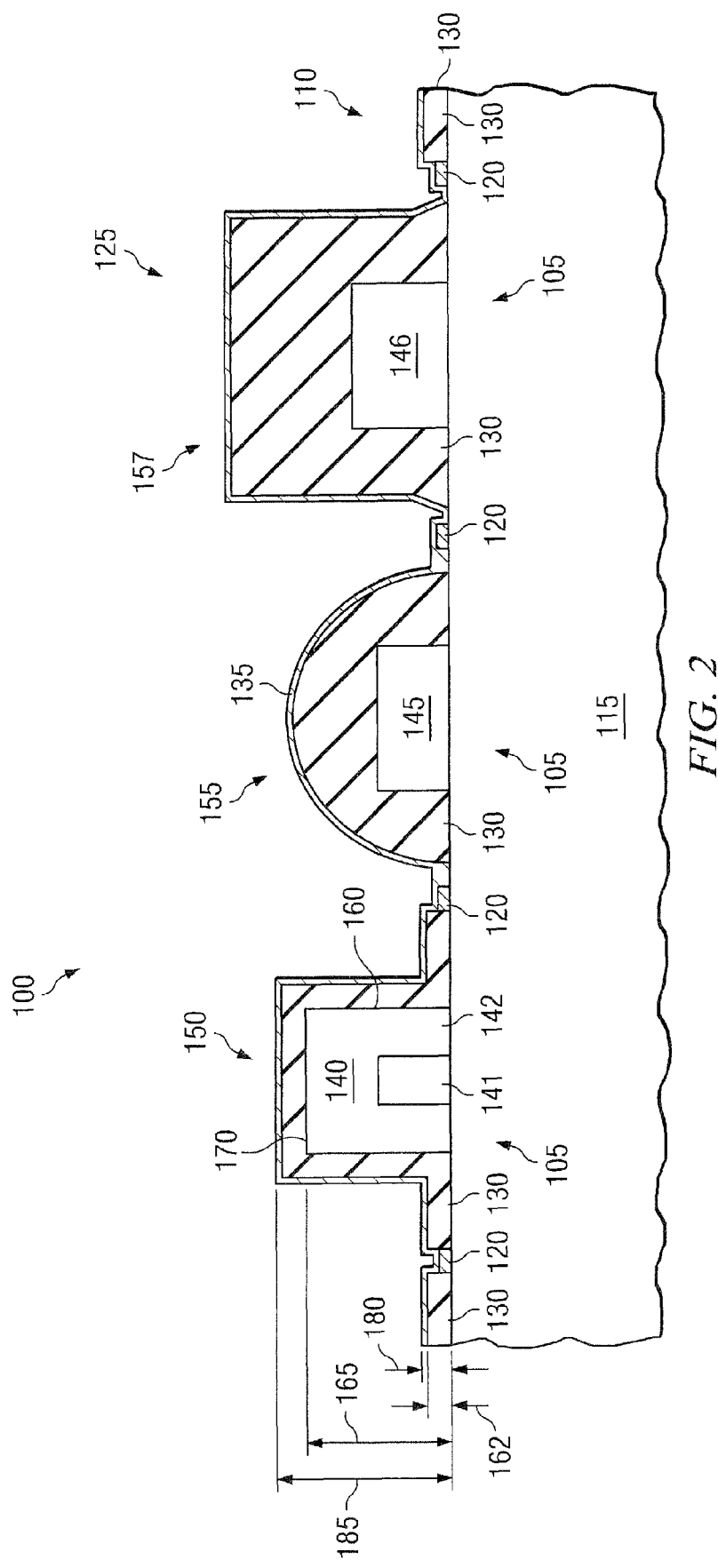

The invention is described with reference to example embodiments and to accompanying drawings, wherein:

FIG. 1 illustrates a plan view of an example electrical device of the invention;

FIG. 2 presents a cross-sectional view of the example device shown in FIG. 1; and FIGS. 3-6 illustrate cross-sectional views of an example method of manufacturing an electrical device of the invention.

DETAILED DESCRIPTION

FIG. 1 presents a plan view of an example electrical device 100 of the invention. FIG. 2 presents a partial cross-sectional view of the device 100, through view line 2-2. The device 100 comprises an electronic component 105 mounted to a surface 110 of a PCB 115. A ground connection 120 is located on the surface 110 of the PCB 115. The device 100 also comprises electromagnetic interference (EMI) shielding 125. The EMI shielding 125 includes an electrical insulator 130 that coats the electronic component 105. The electrical insulator 130 also physically contacts the surface 110. The shielding 125 further includes a conductive layer 135 covering the electrical insulator 130, and physically contacting the electrical insulator 130 and the ground connections 120.

The term electronic component as used herein refers to one or more of the parts of an electronic device that can generate EMI or whose operation can be effected by EMI. E.g., the electrical component 105 can comprise one or more integrated circuit package 140 (e.g., an integrated circuit die 141 optionally surrounded by an injection mold 142); RF device 145 such as an amplifier or filter, (e.g., a power amplifier 146 or a Surface Acoustic Wave (SAW) filter 147, respectively); or passive or active electrical devices 148 such as capacitors and transistors, respectively; or other components well know to those skilled in the art.

In some cases, the cost and the complexity of the manufacturing process is reduced if a plurality of electronic components 105 are located under the same EMI shield 125. In other cases, however, one electronic component 105 can generate EMI that affects another electronic component 105 that is under the same shield 125. E.g., a power amplifier 146 shielded together with an integrated circuit package 140 could interfere with the integrated circuit's 141 performance. In such cases, it is desirable to separately shield each electronic component 105. In particular, it is desirable to separately shield any electronic component 105 that generates EMI (e.g., a power amplifier 146), or that is highly susceptible to EMI (e.g., an integrated circuit 141).

Some preferred embodiments of the electrical insulator 130 comprise an insulating layer that electrically insulates the conductive layer 135 from the electronic component 105. In some cases it is desirable for the electrical insulator 130 to form a conformal coating 150, such as shown in FIG. 2, over the electronic component 105. Conformal coatings, as well known to those skilled in the art, follow the contours of the underlying electronic component. A conformal coating 150 of the electrical insulator 130 takes on the shape of the electronic component 105 such that one can, e.g., visualize the typography of the underlying electronic component 105.

A conformal coating 150 of the electrical insulator 130 is preferred in instances where individual electronic components 105 are being shielded from each other. Additionally, a conformal coating 150 is advantageous because it minimizes the space occupied by the shielded component 105, thereby facilitating the production of smaller devices 100.

In other embodiments, however, the electrical insulator 130 does not form a conformal coating. That is, the electrical insulator 130 need not take the shape of the underlying electronic component 105. E.g., as shown in FIG. 2, at least a portion of the electrical insulator 130 can form an amorphous structure (e.g., a globule 155 or block 157) that coats the electronic component 105. Alternatively, the electrical insulator 130 can be applied via injection molding or similar process, to form a rectangular block 157, or other non-conformal shape around the electronic component 105. The amorphous globule 155 or block 157 can comprise, e.g., a droplet of epoxy resin, or an insulating paint.

In some cases, it is important for the electrical insulator 130 to be adhered to one or both of the surface 110 of the PCB 115 and an outer surface 160 of the component 105 being shielded. Adhering can be accomplished by conventional chemical or physical bonding of the electrical insulator 130 to the component's outer surface 160. E.g., when the electronic component 105 comprises an integrated circuit package 140, the electrical insulator 130 can be adhered to the injection mold 142 that surrounds the integrated circuit die 141.

Adhering the insulator 130 to the PCB 115 and to the electronic component 105 advantageously helps to prevent the component 105 from moving relative to the PCB 115 when the device 100 is subjected to a mechanical force, e.g., by being dropped. Movement of the component 105 relative to the PCB 115 is undesirable because electrical connections between the component 105 and the PCB 115 or other components, could be broken. Adhering the insulator 130 to the surface 110 is also desirable in applications where the electronic component 105 is subjected to harsh environmental conditions such as found in some military applications. E.g., the adhering the conformal coating electrical insulator 130 to the surface 110 can form a hermetic seal around the electronic component 105, thereby making it more resistant to failure in corrosive or moist environments.

In some embodiments the electrical insulator 130 comprises a material that is a liquid or flowable during the coating process but then cures to a hardened state. In other embodiments, however, the insulator 130 after curing remain flexible and rubbery. Some preferred embodiments of the electrical insulator 130 comprise a thermoset or a thermoplastic polymer. Examples of materials that are flexible after curing include thermoset polymers such as epoxy resins, polyimides, or thermoplastic polymers such as polyesters (e.g., MYLAR®). An example of rigid insulating material include paints comprising polyvinyl acetate and epoxy-based compounds.

It is important for the electrical insulator 130 to be of sufficient thickness 162 so that it covers all portions of the electronic component 105. At the same time, the insulator 130 should not be overly thick so as to increase the total space occupied by the shielded component 105, or to waste materials and time spent in the formation of the shielding 125. E.g., in some preferred embodiments, the electrical insulator 130 has a uniform thickness 162 ranging from about 0.5 to 1 mm. Such a thickness range is desirable when, e.g., the electronic component 105 has a step height 165, of about 1 millimeter above the PCB's surface 110. The term step height 165 refers to the difference in height from the top 170 of the electronic component 105 to the PCB surface 110. In such cases, this thickness range is conducive to avoiding the creation of voids across the transition from the PCB's surface 110 to the top surface 170 of the component 105. The range of thickness 162 would be adjusted to insure coverage of different electronic components 105 having different step heights 165.

The conductive layer 135 is configured to block EMI from passing into or from one electronic component 105 to another electronic component 105 of the device 100, or from an external EMI source 175 or into an external electrical device 177. It is important for the conductive layer 135 to contact the insulator 130 because this minimizes the profile of the device 100. In some preferred embodiments, the conductive layer 135 follows the structural contours of the electrical insulator 130. E.g., when the electrical insulator 130 is configured as a conformal coating 150, the conductive layer 135 can also be configured as a conformal conductive coating.

Preferably, the conductive layer 135 is adhered to the electrical insulator 130 so that the EMI shielding 125 remains intact during the operation or transport of the device 100. Adhering comprises conventional chemical or physical bonding of the conductor layer 135 to the electrical insulator 130. Preferred conductive layers 135 comprise one or more layers of a metal (e.g., aluminum, copper) or a metal alloy (e.g., steel).

It is important for the conductive layer 135 to have a thickness 180 in a range that is conducive to providing a continuous EMI shield 125, but not too thick as to unnecessarily increase the profile of the device 100 or waste time and materials. In some cases, a conductive layer 135 thickness 180 of greater than about 2 microns is undesirable because there will be unnecessary material costs and time spent to form the conductive layer 135, and because the vertical profile of the device 100 will be unnecessarily increased. E.g., in some preferred embodiments, the conductive layer 135 has a thickness 180 ranging from about 0.5 to 2 microns.

A thickness 180 of less than 0.5 micron is undesirable in cases where the step height 165 is too large to ensure that the conductive layer 135 forms a continuous covering over the electronic component 105. This can be the case when, e.g., the step height 165 is greater than or equal to about 1 mm. Having a gap in the conductive layer's 135 covering is undesirable because EMI can enter or exit through the gap and affect the performance of the electronic component 105 being shielded.

Preferred embodiments of the shielded electronic component 105 have a low vertical profile because this facilitates the manufacture of smaller devices 100. In some preferred embodiments, the profile height 185 of the shielded electronic component 105 is less than or equal to about two millimeters, and more preferably, less than or equal to about one millimeter. The term profile height 185 refers to the step height 165 of the electronic component 105, plus the thickness 162 of the insulating layer 130, plus the thickness 180 of the conductive layer 135.

Some preferred embodiments of the device 100 are configured as an electrical communication device. Some electrical communication devices of the invention are configured to send and receive radiofrequency signals. The electrical communication device can send or receive the radiofrequency signals through wires or wirelessly. Examples include cellular phone, pagers, Global Positioning System (GPS) locators, moving picture expert group audio layer-3 (MP3) players, or radio or television receivers.

As illustrated in FIG. 1, the electrical communication device 100 comprises a plurality electronic components 105 mounted to a surface 110 of a PCB 115 and one or more ground connections 120 on the surface 110. At least one of the electronic components 105 comprises an integrated circuit die 141 surrounded by an injection mold 142. The integrated circuit 141 can be configured to control the device power management, performs GPS functions, serve as memory storage, or other functions. When the device 100 is configured as a cellular phone the plurality of electronic components can further include one or more RF devices 145 (radio transceiver, digital base band modem) power amplifiers 146, SAW filter 147, or other components well known to those skilled in the art, such as crystal oscillators, switches, voltage regulators, or battery monitors.

The electrical communication device 100 can further include any of the embodiments of electromagnetic interference (EMI) shielding 125 as described above. E.g., embodiments of the shielding 125 can include an electrical insulator 130 coating one or more of the electronic components 105 the electrical insulator adhered to the surface 110 and to the injection mold 142. The shielding 125 further includes a conductive layer 135 adhered to the electrical insulator 130 and contacting the one or more ground connections 120 on the surface 110. The conductive layer 135 is configured to block EMI to or from the electronic components 105.

Another aspect of the invention is a method of manufacturing an electrical device. FIGS. 3-6 illustrate cross-sectional views of selected steps in an example method of manufacturing an electrical device 300 of the invention. Any of the embodiments of the electrical device 100 discussed in the context of FIGS. 1 and 2 can be manufactured by the method.

FIG. 3 shows the device 300 after mounting an electronic component 305, one in some cases, a plurality of components 305, to a surface 310 of a printed circuit board 315. Mounting can be achieved by any number of conventional processes including ball grid arrays (BGA), quad flat packages (QFPs), quad flat non-leaded package (QFM), lead frames, flip chip ball-grid array (FCBGA). In some cases a leadless mounting is preferred because this is facilitates attaining uniform shielding of the electronic component. E.g., covering the leads with insulator and conductive coatings can be problematic because the conductive coating can create a short circuit between leads.

FIG. 3 also shows the device 300 after forming a ground connection 320 on the surface 310. E.g., conventional techniques can be used to pattern a metal layer (e.g., copper or aluminum) on a PCB 315 to form one or more ground connections 320 configured as lines or pads on the PCB's surface 310.

Figure 5:
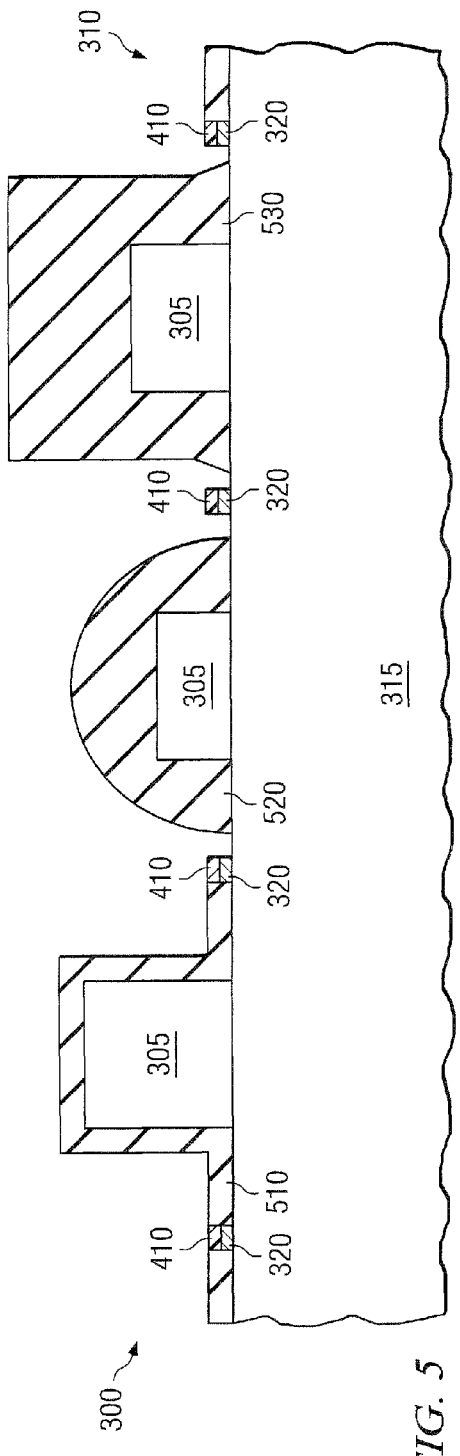
Figure 6:
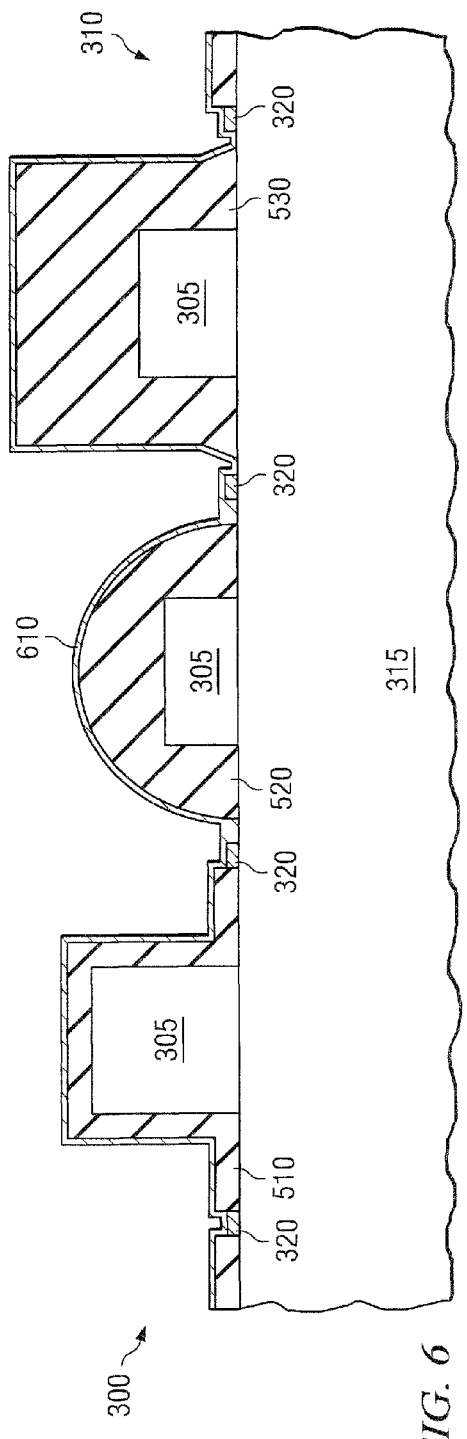

FIGS. 4-6 the device 300, analogous to FIGS. 3 and 4, at different steps in the shielding the electronic component 305. FIG. 4 shows the device 300 after forming a mask 410 over the ground connection 320. Preferably, the mask 410 is formed before coating the component with an insulator so that the ground connection 320 does not get coated. As illustrated in FIG. 4, the mask 410 can be configured as a stencil that covers a layout of one or more of the ground connections 320 on the surface 310 of the PCB 315. The mask 410 can comprise an adhesive tape made of e.g., plastic, paper, or other material, that is easy to cut into a stencil that traces the ground connection layout on the PCB. After cutting out a stencil mask 410, the adhesive side of the mask 410 is laid down on the PCB 315 so that the ground connection 320 is covered.

FIG. 5 shows the device 300 after coating the electronic component 305 with an electrical insulator 510. As shown, the electrical insulator 510 contacts the PCB surface 310. E.g., the electrical insulator 510 can contact all of the exposed areas of the PCB surface 310 that were not covered by the mask 410.

In some embodiments, coating comprises spraying the electronic component 305 with a layer of insulating material. Preferred insulating materials for forming a conformal coat include thermoplastic or thermoset polymers. However, other material, such as described above in the context of FIGS. 1-2, can be used. Alternatively, coating can comprise dipping the electronic component 305 and PCB 315 into a liquid insulating material.

In still other cases, a discrete amorphous structure (e.g., a globule 520 or block 530) of insulating material can be placed onto the electrical component 305 such that the component 305 and an adjacent portions of the surface 310 are covered by the insulator 510. E.g., a liquid droplet of an epoxy insulator 510 can be dropped onto the component 305. Preferably, the volume of the droplet is adjusted such that it flows just far enough to coat the component 305 as well as the immediate surrounding areas of the PCB surface 310, but not adjacent ground connections 320. The advantage of this approach is that it avoids the need to place a mask over the ground connection 320.

FIG. 6 shows the device 300 after covering the electrical insulator 510 (and underlying component 305) and the PCB surface 310 with a conductive layer 610 such that the conductive layer 610 contacts the electrical insulator 510 and the ground connection 320. Covering with the conductive layer 610 can comprise a physical vapor deposition, or a chemical vapor deposition of a metal or metal alloy onto the electrical insulator 510. E.g., the physical vapor deposition can comprise sputtering a vapor of metal, e.g., copper or aluminum, or metal alloy, e.g., steel.

In cases where a mask 410 has been applied to cover the ground connection 320, the mask 410 (FIG. 5) is preferably removed before covering with the conductive layer 610. E.g., a stencil mask 410 can be peeled away or chemically dissolved so that the ground connection 320 is exposed, allowing the conductive layer 610 to make direct physical contact with the ground connection 320.

Although the present invention has been described in detail, those skilled in the art should understand that they could make various changes, substitutions and alterations herein without departing from the scope of the invention in its broadest form.

The invention claimed is:

1. An electrical device, comprising:
    an electronic component mounted to a surface of a printed circuit board;
    a ground connection on said surface; and
    electromagnetic interference (EMI) shielding that includes:
    a non-conformal electrical insulator coating said electronic component, said insulator contacting said surface, and
    a conductive layer covering said electrical insulator, and contacting said electrical insulator and said ground connection.

2. The device of claim 1, wherein said conductive layer is adhered to said electrical insulator.

3. The device of claim 1, wherein said conductive layer has a thickness ranging from about 0.5 to 2 microns.

4. The device of claim 1, wherein said conductive layer comprises one or more layers of metal or a metal alloy.

5. The device of claim 1, wherein said electrical insulator is adhered to said surface and to an outer surface of said electronic component.

6. The device of claim 1, further comprising a second electronic component mounted to the surface of a printed circuit board;
    a conformal electrical insulator coating said second electronic component; and
    said conductive layer covering said conformal electrical insulator.

7. The device of claim 1, wherein said electronic component comprise an integrated circuit package that includes an integrated circuit chip surrounded by an injection mold, said electrical insulator adhered to said injection mold.

8. The device of claim 1, wherein said electrical insulator comprises an amorphous structure.

9. The device of Claim 1, wherein a thickness of said insulating layer ranges from about 0.5 to 1 millimeters.

10. The device of claim 1, wherein a total step height of said electronic component plus a thickness of said insulating layer plus a thickness of said conductive layer is less than or equal to about 2 millimeters.

11. An electrical communication device, comprising:
   a plurality electronic components mounted to a surface of a printed circuit board, wherein at least one of said electronic components comprises an integrated circuit die surrounded by an injection mold;
   one or more ground connections on said surface; and
   electromagnetic interference (EMI) shielding that includes:
   a non-conformal electrical insulator coating one or more of said electronic components, said electrical insulator adhered to said surface and to said injection mold; and
   a conductive layer adhered to said electrical insulator and contacting said one or more ground connections on said surface, wherein said conductive layer is configured to block electromagnetic interference (EMI) to or from said electronic components.

12. A method of manufacturing an electronic device comprising:
   mounting an electronic component to a surface of a printed circuit board;
   forming a ground connection on said. surface; and
   shielding said electronic component, including:
      coating said electronic component with a non-conformal electrical insulator, said electrical insulator contacting said surface; and
      covering said electrical insulator and said surface with a conductive layer such that said conductive layer contacts said electrical insulator and said ground connection.

13. The method of claim 11, further including forming a mask over said ground connection before said coating and then removing said mask before said covering.

14. The method of claim 1, wherein said mask is configured as a stencil that covers a layout of said ground connection on said surface.

15. The method of claim 13, wherein said mask comprises an adhesive tape.

16. The method of claim 12, wherein coating with said insulating layer comprises spraying said electronic component with an insulating material.

17. The method of claim 11, wherein coating with said insulating layer comprises dipping said electronic component in an insulating material.

18. The method of claim 12, wherein coating with said insulating layer comprises dispensing a discrete globule of insulating material on said electrical component such that said electrical component and an adjacent portions of said surface are covered by said insulating layer.

19. The method of claim 12, wherein covering with said conductive layer comprises a physical vapor deposition, or a chemical vapor deposition of a metal or metal alloy on said electrical insulator.

20. The method of claim 19, wherein said physical vapor deposition comprises sputtering a vapor of a metal or metal alloy.

21. The device of claim 1, wherein said non-conformal electrical insulator coating has the shape of one of: a globule and a rectangular block.

22. The device of Claim 11, further comprising:
   a conformal electrical insulator coating another of said electronic components; and
   said conductive layer covering said conformal electrical insulator.

23. The method of claim 12, further comprising:
   mounting another electronic component to the surface of the printed circuit board;
   coating another of said electronic components with a conformal electrical insulator; and
   covering said conformal electrical insulator with said conductive layer.

* * * * *